SEMICONDUCTOR APPARATUS
Filed Aug. 14, 1957
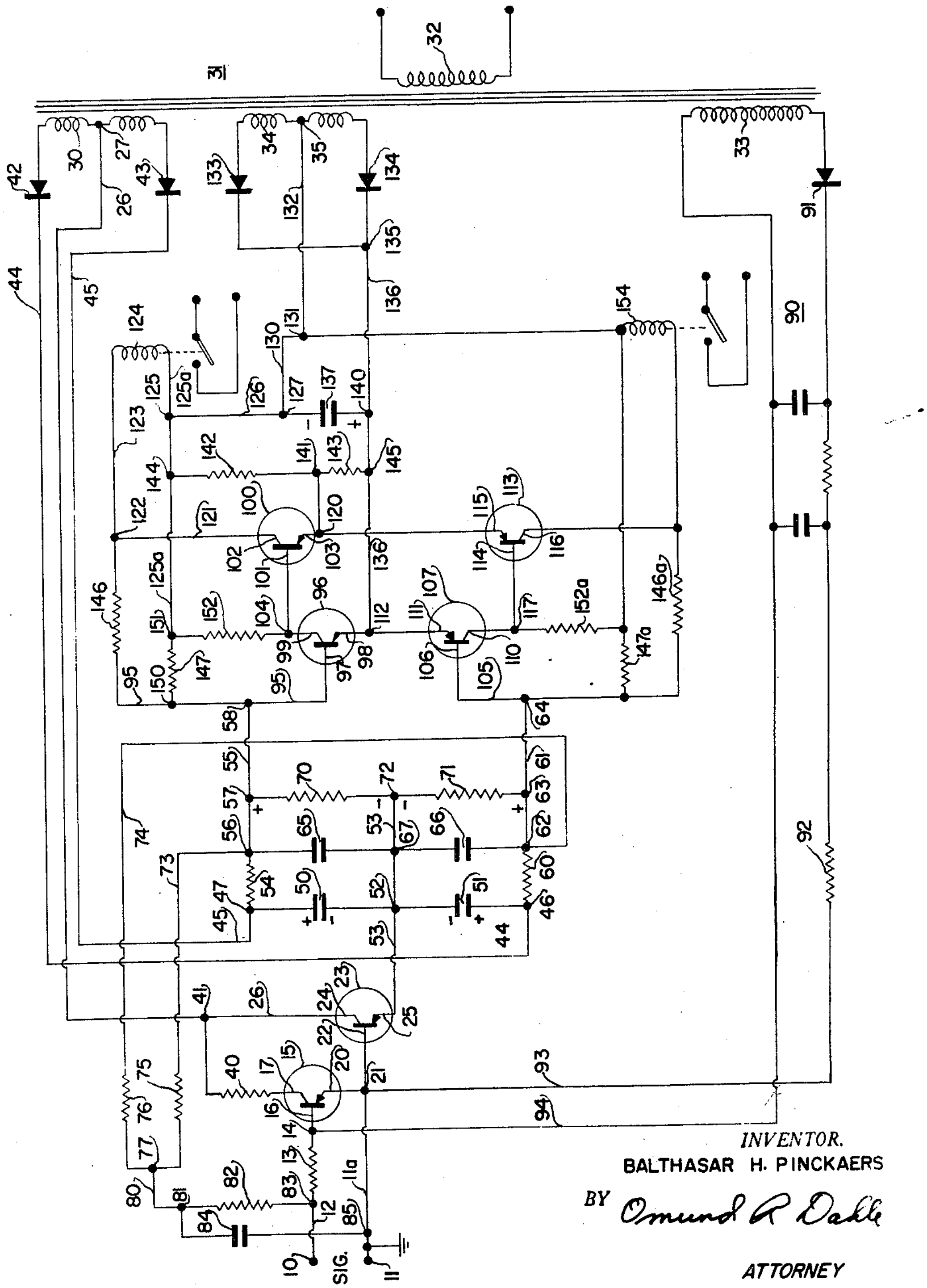
INVENTOR.
BALTHASAR H. PINCKAERS
BY Omund R. Dahle
ATTORNEY

United States Patent Office 2,911,545

Patented Nov. 3, 1959

2,911,545

SEMICONDUCTOR APPARATUS

Balthasar H. Pinckaers, Hopkins, Minn., assignor to Minneapolis-Honeywell Regulator Company, Minneapolis, Minn., a corporation of Delaware Application August 14, 1957, Serial No. 678,138

12 Claim. (Cl. 307—88.5)

This invention relates generally to improved semiconductor control apparatus and relates more specifically to new and improved transistor phase selective condition control circuits.

It is an object of this invention to provide a new and improved transistor condition control apparatus which has an improved transistor demodulator circuit.

Another object of this invention is to provide an improved transistor control apparatus which is relatively unaffected by a wide range of capactive reactance in the input circuit.

Another object of this invention is to provide in a transistor amplifier discriminator an improved stabilizing circuit.

These and other objects of the present invention will be understood upon a consideration of the accompanying specification, claims and drawings of which:

The single figure of the drawing is a schematic representation of a transistor control circuit embodying the invention.

Referring now to the drawing there is disclosed a pair of input terminals 10 and 11, which are adapted to be connected to a source of signal potential, not shown. The signal source may be a condition responsive bridge circuit having a condition responsive member in one leg of the bridge, such as a temperature responsive member or a humidity responsive member or other member which is effective to change resistance in response to a condition. The conductor 10 is connected by means of a conductor 12, a resistor 13 and a junction 14 to a base electrode 16 of a junction transistor 15. The transistor 15 also includes a collector electrode 17 and an emitter electrode 20. The input electrode 11 is connected by means of a conductor 11*a* and a junction 21 to the emitter electrode 20. The junction 21 is directly connected to a base electrode 22 of a junction transistor 23, which transistor also includes a collector electrode 24 and an emitter electrode 25. The collector electrode 24 of transistor 23 is connected by means of a conductor 26 to a center tap 27 of a secondary winding 30 of a power transformer 31. The transformer 31 has a plurality of windings including a primary winding 32 adapted to be energized from a suitable source of alternating current power, and secondary windings 33 and 34.

The collector electrode 17 of transistor 15 is connected by means of a resistor 40 to a junction 41 on the conductor 26. The upper and lower extremities of the secondary winding 30 are connected through rectifying diodes 42 and 43, respectively, and through conductors 44 and 45 to a pair of junctions 46 and 47. A pair of series connected capacitors 50 and 51 have their extremities connected to the junctions 47 and 46. A junction 52 between the two capacitors is directly connected by a conductor 53 to the emitter electrode 25 of transistor 23.

The junction 47 is connected by a resistor 54 to a conductor 55 which has located thereon junctions 56, 57 and 58. The junction 46 is connected by a resistor 60 to a conductor 61 which has junctions 62, 63 and 64 thereon.

A pair of capacitors 65 and 66 are connected from the junctions 56 and 62, respectively, to a junction 67 on the conductor 53. A pair of resistors 70 and 71 are connected from the junctions 57 and 63, respectively, to a junction 72 on the conductor 53.

A stabilizing feedback network is connected from the junctions 56 and 62, respectively, through conductors 73 and 74 and through resistors 75 and 76, respectively, to a junction 77, through a conductor 80, a junction 81 and a resistor 82 to a junction 83 on the input conductor 12. A bypass capacitor 84 connects the junction 81 to the ground conductor 11*a* at a junction 85, and is effective to bypass any ripple current at this point due to ripple existing at junctions 56 and 62.

A constant current source 90, comprising the secondary winding 33 of transformer 31, rectifying diode 91, a conventional RC filter and a relatively large resistance 92 is connected by a pair of conductors 93 and 94 to the emitter and base electrodes of the transistor 15. This constant current producing circuit causes a quiescent current to flow from the emitter 20 to the base electrode 16 thereby establishing the quiescent conducting conditions for the transistors 15 and 23.

The junction 58 on the conductor 55 is connected by a conductor 95 to a base electrode 97 of a junction transistor 96. The transistor 96 also includes an emitter electrode 98 and a collector electrode 99. Another transistor 100, which has a base electrode 101, a collector electrode 102 and an emitter electrode 103 has its base electrode 101 connected to the collector electrode 99 of transistor 96 at a junction 104. A conductor 105 connects the junction 64 on the conductor 61 to a base electrode 106 of a junction transistor 107. The transistor 107 also includes a collector electrode 110 and an emitter electrode 111. The emitter electrode 111 is directly connected to the emitter electrode 98 by a junction 112. Another transistor 113 which has a base electrode 114, an emitter electrode 115 and a collector electrode 116, has its base electrode 114 directly connected to the collector electrode 110 at a junction 117. The emitter electrodes 103 and 115 of the transistors 100 and 113 are connected together at a junction 120.

The collector electrode 102 of transistor 100 is connected by a conductor 121, a junction 122, a conductor 123, a winding of a relay 124, a junction 125, a conductor 126, a junction 127, a conductor 130, a junction 131, and a conductor 132 to the negative terminal of a D.C. power supply at the center tap 35 of secondary winding 34 of transformer 31. The upper and lower extremities of the secondary winding 34 are connected through rectifying diodes 133 and 134, respectively, through a junction 135 to a conductor 136. The conductor 136 terminates at junction 112 which directly connects to the emitter electrodes 98 and 111. The A.C. potential on winding 34 is thus rectified by the diodes 133 and 134 to provide a full wave rectified potential power source between conductor 136 and conductor 132. A capacitor 137 connected across the power supply from a junction 140 on the conductor 136 to the junction 127 is effective to filter the rectified supply potential. The emitter electrodes 103 and 115 are connected to an intermediate tap 141 of a voltage divider resistance comprising a pair of resistors 142 and 143 which are connected between a junction 144 on the conductor 125*a* and a junction 145 on the conductor 136.

A feedback connection exists from the junction 122 in the collector circuit of transistor 100 through a resistor 146 and conductor 95 to the base electrode 97 of the transistor 96. A biasing resistor 147 is also connected between a junction 150 on the conductor 95 and a junction 151 on the conductor 125*a* which is the negative power lead. A resistor 152 connects the collector electrode 99 and the base electrode 101 of transistors 96 and 100, respectively, to the junction 151 on the conductor 125a. Similar components interconnect the electrodes of the identical lower switching circuit comprising transistors 107 and 113 to control the energization of a relay 154.

*Operation*

In considering the operation of this control circuit, let it be assumed for convenience in explanation, that the input electrodes 10 and 11 are connected to an alternating current energized temperature sensitive bridge circuit. A temperature sensitive bridge is chosen as being representative of a type of condition responsive circuit. The bridge circuit may be energized by the same alternating current source which is connected to energize the primary winding of transformer 31. The signal from the bridge may be reversible in phase depending upon the direction of deviation of temperature from a predetermined null point. The resistor 13 located between terminal 10 and base electrode 16 allows a wide choice of source resistance without the necessity of using a coupling capacitor. For example, no appreciable change in D.C. bias results when the terminals 10 and 11 are switched from a 500 ohm source to a 2000 ohm source.

The amplifier discriminator stage comprising the transistors 15 and 23, the secondary winding 30 of transformer 31, the capacitors 50, 51, 65, 66 and the other associated components operate substantially in the manner to be explained hereafter. It will be noted that the transistors 15 and 23 are directly coupled together, the emitter 20 of transistor 15 being directly connected to the base electrode 22 of transistor 23. The collector electrodes are connected to a common potential source, the collector 17 being connected through the current limiting resistance 40 to the collector electrode 24 of transistor 23. Resistor 40 limits possible dissipation in transistor 15 and can be omitted from a functional standpoint. It will be noted that the emitter to collector current flowing in transistor 15 must come from the base circuit of transistor 23.

In order to provide a quiescent operating point for the stages 15 and 23, a constant current is provided to bias the transistor 15 into the desired condition of operation. The alternating current from secondary winding 33 of transformer 31 is rectified by the junction rectifying diode 91 and after being filtered by a conventional filter the current flows through the relatively high resistance 92 and through the transistor 15 from emitter 20 to base electrode 16. It is obvious, of course, that the rectified and filtered supply 90 may be replaced by any other suitable D.C. source, such as a battery. The constant current flowing through the transistor 15 establishes a quiescent operating point for both transistor 15 and transistor 23.

The output circuit of the transistor 23 provides a phase discriminating action in which a reversible D.C. output potential results, the polarity of the output potential being dependent upon the phase of the signal at input terminals 10 and 11. The magnitude of the D.C. output potential is proportional to the magnitude of the signal input. It will be noted that the collector electrode 24 of transistor 23 is directly connected to the center tap 27 of the secondary winding 30 of transformer 31. The upper and lower extremities of the secondary winding 30 are connected to rectifiers 42 and 43 so that full wave rectification of the induced voltage occurs. During the half cycle of energization wherein the upper terminal of winding 30 is positive with respect to the center tap 27, a current path can be traced through the rectifying diode 42, conductor 44, junction 46, through the capacitor 51, junction 52, conductor 53, through transistor 23 from emitter 25 to collector 24, and through conductor 26 back to the center tap 27 of secondary winding 30. During the succeeding half cycle when the lower terminal of winding 30 is positive, a current path can be traced through the diode 43, the conductor 45, through the capacitor 50, the junction 52, the conductor 53, through the transistor, and back to the center tap connection 27 through the conductor 26.

The pulsating D.C. current flowing through capacitors 51 and 50 tends to charge the capacitors so that the junctions 46 and 47 are positive with respect to the junction 52. A D.C. current path may be traced around capacitor 51 which includes the resistor 60, the conductor 61, the junction 63, the resistor 71, the junction 72 and conductor 53 to the junction 52. A similar D.C. path may be traced around the capacitor 50 which includes the resistor 54, the conductor 55, the junction 57, the resistor 70, the junction 72, and the conductor 53, to junction 52. The currents flowing in these paths through the resistors 71 and 70 result in D.C. potentials at junctions 57 and 63 which are positive with respect to the junction 72.

Under conditions of zero signal at input terminals 10 and 11, the currents flowing through transistor 23 during both half cycles of the energizing source are substantially equal and therefore the capacitors 51 and 50 charge to approximately the same potentials. The currents flowing through resistors 71 and 70, therefore, are substantially equal and substantially no potential difference exists between the junctions 57 and 63.

Let us assume now that a condition change occurs so that the bridge is unbalanced and an A.C. signal appears at input terminals 10 and 11 which is of a phase to cause the transistors 15 and 23 to be more conductive during the half cycle when the upper terminal of secondary winding 30 is positive. Under these conditions the current flow through the transistor 23 will be increased when capacitor 51 is charging and will be decreased when capacitor 50 is charging. This results in a larger potential existing across resistor 71 than across resistor 70 so that the potential at conductor 61 will be positive with respect to the potential on conductor 55. As the magnitude of the signal increases the difference between the potentials developed across capacitors 51 and 50 increases and the D.C. output potential increases as the function of the signal strength. If the phase of the signal potential is reversed, the polarity of the D.C. output potential will be reversed in polarity.

A negative feedback circuit which provides D.C. stabilization, but which does not cause A.C. feedback is connected between the junctions 56 and 62 and the input circuit to transistor 15. A first path can be traced from the junction 56 through 73 and resistor 75 to the junction 77, and through the conductor 80 and resistor 82 to junction 83 on input conductor 12. The second path can be traced from junction 62 through the conductor 74 and resistor 76 to the junction 77, and then through the same path to input conductor 12. The resistors 75 and 76 are preferably matched resistors whereby under no signal conditions an equal D.C. feedback results through the two resistors from the equal potential points 56 and 62. If for some reason, such as aging effects or an increase in ambient temperature in which the transistor is operating, the conductivity or leakage current of transistor 23 increases, then both of the junctions 56 and 62 become more positive with respect to conductor 53 which in turn increases the D.C. feedback current through the resistors 75 and 76 to the base of transistor 15 which reduces the conduction of transistor 15 and also transistor 23 and thereby stabilizes the collector currents of transistors 15 and 23 and thus the D.C. voltage across capacitors 65 and 66.

It is obvious from the figure that the portions of the circuit to the right of junction 57 and junction 63 are acted upon only by the net D.C. voltage existing between said junctions and not by the voltages existing across capacitors 65 and 66. The net voltage between junctions 57 and 63 is zero (or substantially so) in the absence of A.C. signal input and this remains so for any condition of leakage current in either transistor 15 and/or transistor 23, even if conductors 73 and 74 and resistors 75 and 76 are eliminated. However, as shall be shown later, it is necessary that for proper operation with A.C. input signal, the voltages existing across capacitors 65 and 66 must be able to decrease or increase in response to A.C. signals. In order to meet this operating condition at any condition of leakage current, which is temperature dependent, it is necessary to stabilize the voltages across capacitors 65 and 66. This is done by negative feedback through the two feedback loops which include resistors 75 and 76.

The feedback circuit causes no negative feedback in response to A.C., since an A.C. signal causing junction 56 to go more positive also simultaneously causes junction 62 to become less positive by an equal amount, and the magnitude of the summation of the feedback currents in the two paths remains unchanged.

Although the use of two direct coupled transistors 15 and 23 have been disclosed in this invention it is apparent that the circuit can also operate in the same manner with one transistor if extreme sensitivity is not needed. This then would eliminate transistor 15, and the constant current bias source would then be connected to transistor 23.

Another advantage of this transistor control circuit is that the differential type phase discriminator circuit is substantially unaffected by quadrature signals, that is signals which are 90° displaced from the supply voltage. In the field of condition responsive, phase sensitive electronic control circuits, the problem often exists that the sensing element is remote from the control circuit, and the connecting wires between the sensing element and the control circuit due to the distributed capacity of the connecting leads place, in effect, a capacitance in parallel with the sensing element. In most control circuits of this type compensation must be made, by the use of additional circuitry, to eliminate the effects of the quadrature signal. In many circuits the quadrature signal, if not compensated for, may become large enough to actuate one or both of the output relays, or prevent the relays from dropping out when the control signal is reduced.

In this phase sensitive circuit, which is of an integrating type, because it integrates, in effect, the increase or decrease in conduction of transistor 23 as caused by an output signal, and since it is of a differential output type, because it compares the results of said integrations, it can be seen that a quadrature signal will, during the half cycle that capacitor 50 is being charged, increase the conduction of transistor 23 during the quarter cycle and decrease the conduction during the other quarter cycle so that there is no net change in D.C. voltage across capacitor 50. The same is true for capacitor 51. Because the phase sensitive circuit is of the differential type it can be seen that no change in voltage occurs between junctions 58 and 64 as the result of a D.C. input signal. A D.C. signal will cause the voltages across capacitors 65 and 66 to increase by equal amounts which are relatively small. This is due to the combined degenerative effect of resistors 75 and 76 for D.C. The voltage between junctions 58 and 64 remains at zero.

It is also possible to insert an input signal which consists of an A.C. signal superimposed on a D.C. signal. The circuit will only react to the A.C. component of that signal.

Another useful aspect of this integrating differential type discriminator circuit is that it can also be used as a phase shift detector or indicator. If the magnitude of the A.C. input signal, which is of the same frequency as the reference voltage, is held constant, but the phase is varied, it is easily seen that the D.C. output magnitude is dependent on the phase angle.

The transistors 96 and 100 form a first transistor switching circuit, and the transistors 107 and 113 form a second transistor switching circuit. Under normally deenergized conditions of the switches, the transistor 96 is conductive and the transistor 100 is substantially non-conductive. Likewise, the transistor 107 is conductive and the transistor 113 is substantially non-conductive. A current path may be traced from the positive junction 140 of the filter capacitor 137 of the rectified supply, through conductor 136, junction 112, from emitter to base of transistor 96, through conductor 95, junction 150, resistor 147, junction 151, conductor 125a, junction 125, and conductor 126 to the negative junction 127 of the filter capacitor. The base current flowing in the transistor 96 renders the transistor conductive and a current also flows from emitter 98 to collector electrode 99, and through resistor 152 to conductors 125a and 126, and thus back to the source. Since the transistor 96 is biased into a relatively conductive state, the output impedance is relatively small and most of the source potential appears across the load resistor 152. The voltage divider consisting of series connected resistors 142 and 143 maintains the emitter electrode 103 of transistor 100 at a potential which is slightly negative with respect to base electrode 101 under these conditions. By this method the transistor 100 is maintained at a state of virtual non-conduction. Similar current paths exist for the transistor 107 and the transistor 113 is maintained non-conductive by the same means.

It will be noted that relay load devices 124 and 154 connect the collector electrodes 102 and 116, respectively, to the negative terminal of the source of supply potential. A feedback resistor is connected from the collector electrode of each of transistors 100 and 113 to the base electrodes 97 and 106, respectively, of transistors 96 and 107. Under the initial operating condition of the switch, substantially no current flows through the output circuit of transistor 100 and the potential drop across the relay winding 124 is insignificant so that the potential at the collector electrode 102 approaches the negative potential at center tap 35. During this time the feedback resistor 146 is effectively in parallel with resistor 147 which is the base bias resistor for transistor 96, and the base current from transistor 96 flows through both resistors 147 and 146.

Let us now consider the case where the condition being sensed has changed causing an unbalance signal to appear from the bridge circuit to signal terminals 10 and 11 whereby a D.C. potential appears on the conductors 55 and 61 with conductor 55 being positive with respect to conductor 61. It will be noted that these conductors are directly connected to the base electrodes 97 and 106 of transistors 96 and 107, respectively. Since the emitter electrodes 98 and 111 of the transistors 96 and 107 are directly connected together, the D.C. potential applied to the base electrodes tends to increase the conduction of transistor 107 and tends to decrease the conductivity of transistor 96. As the D.C. potential becomes sufficiently large to begin to decrease the conduction from emitter 98 to collector 99 of transistor 96, the potential across resistor 152, which is due to the collector current of transistor 96, begins to decrease. A point is reached where the decrease in potential appearing across resistor 152 is sufficient to allow base current to begin to flow in transistor 100. The resulting collector current in transistor 100 causes a potential drop to appear across the relay coil 124. The resulting change in the potential at collector electrode 102 is effective to lessen the base current flowing through feedback resistor 146 with the result that the conduction of transistor 96 tends to be further reduced. Further reduction in the conduction of transistor 96 causes further increase in the conduction of transistor 100. The action is regenerative and the circuit switches to a condition where transistor 100 is conductive and the conduction of transistor 96 is cut off or substantially reduced. This transistor switching action energizes relay 124, and the associated contacts are actuated to control a suitable load circuit, not shown.

The circuit has a predetermined differential so that as the unbalance signal is reduced by a predetermined amount, a reverse action takes place in the switching circuit from that above described and the transistor switch reverts to the condition where transistor 100 is substantially cut off and therefore relay 124 again becomes unenergized. A reversal in phase of the A.C. input signal is effective to reverse the D.C. potential from the discriminator and the second transistor switch comprising transistors 107 and 113 is operable in accordance with the signal magnitude to energize relay load 154.

Although many modifications of this circuit are possible, in one successful embodiment of this circuit the following values were used:

| Item: | Value |
|---|---|
| Transistors **15, 23, 96, 107** | 2N109, 2N132 or 2N369. |
| Transistor **100, 113** | 2N45, 2N367. |
| Resistor **75, 76, 152** | 9100 ohms. |
| Resistor **82** | 6800 ohms. |
| Resistor **13** | 250 ohms. |
| Resistor **40** | 3900 ohms. |
| Resistor **92** | 22K ohms. |
| Resistor **60, 54** | 1500 ohms. |
| Resistor **70, 71** | 5100 ohms. |
| Resistor **146** | 160K ohms. |
| Resistor **147** | 120K ohms. |
| Resistor **142** | 5600 ohms. |
| Resistor **143** | 82 ohms. |
| Capacitor **84** | 10 $\mu$fd. |
| Capacitor **50, 51, 65, 66** | 50 $\mu$fd. |
| Capacitor **137** | 150 $\mu$fd. |
| A.C. Source | 115 volts, 60 cycle. |

In general, while I have shown certain specific embodiments of my invention, it is to be understood that this is for the purpose of illustration and that my invention is to be limited solely by the scope of the appended claims.

I claim:

1. Semiconductor apparatus comprising: semiconductor amplifier means, said means having a plurality of electrodes including a collector electrode, an emitter electrode and a base electrode; transformer means having a plurality of windings including a secondary winding having first and second terminals and an intermediate terminal between said first and second terminals, said transformer means being energized by a source of alternating current potential; means connecting said intermediate terminal to said collector electrode; first and second capacitive means; means including first asymmetrical current conducting means connecting said first terminal to said emitter electrode through said first capacitive means; means including second asymmetrical current conducting means connecting said second terminal to said emitter electrode through said second capacitive means; output impedance means connected to said first and second capacitive means; a source of signal potential connected intermediate said base and emitter electrode; and first and second feedback impedance circuit means connected from said first and second capacitive means, respectively, to said base electrode.

2. Semiconductor apparatus comprising: semiconductor amplifier means, said means having a plurality of electrodes including an output electrode, an input electrode and a common electrode; transformer means energized from a source of alternating current potential, said transformer means having a plurality of windings including a secondary winding having first and second terminals and an intermediate terminal between said first and second terminals; means connecting said intermediate terminal to said output electrode; first and second capacitive means; means including first asymmetrical current conducting means connecting said first terminal to said common electrode through said first capacitive means; means including second asymmetrical current conducting means connecting said second terminal to said common electrode through said second capacitvie means; output impedance means connected to said first and second capacitive means; and a sourec of signal potential connected intermediate said input and common electrodes.

3. Transistor apparatus comprising: transistor amplifying means, said means having a plurality of electrodes including a collector electrode, an emitter electrode and a control electrode; transformer means adapted to be energized from a source of alternating current potential, said transformer means having a center tapped winding having first and second terminal connections thereon; means connecting said center tap to said collector electrode; first and second capacitor means; first circuit means including said first capacitor means connected intermediate said emitter electrode and said first terminal connection; second circuit means including said second capacitor means connected intermediate said emitter electrode and said second terminal connection; first and second asymmetrical current conducting means connected, respectively, in series with said first and second circuit means to rectify the currents at said connections whereby the first and second circuits are rendered conductive on alternate and opposite half cycles; means connecting said control and emitter electrodes to a source of phase reversible alternating signal potential; potential comparing means connected across said first and second capacitor means to provide an output potential proportional to the difference of the potentials across said first and second capacitor means; a pair of matched resistors; first feedback circuit means including one of said matched resistors connected intermediate said first capacitor means and said control electrode; and second feedback circuit means including the second of said matched resistors connected intermediate the second capacitor means and said control electrode.

4. Discriminator apparatus comprising: semiconductor amplifying means, said means having a plurality of electrodes including a collector electrode, an emitter electrode, and a base electrode; transformer means energized from a source of alternating power, said transformer means including winding means having first and second terminals and an intermediate terminal therebetween; means connecting said intermediate terminal to said collector electrode; first and second asymmetric conducting means, said first and second means being connected, respectively, in circuit with said first and second terminals; first and second capacitive means; first circuit means including said first asymmetric conducting means and said first capacitive means connected intermediate said first terminal and said emitter electrode; second circuit means including said second asymmetric conducting means and said second capacitive means connected intermediate said second terminal and said emitter electrode; impedance means connected to said first and second capacitive means; differential output means connected to said impedance means; a source of alternating signal potential, said signal source being connected intermediate said base and emitter electrodes; and first and second feedback circuits connected from said first and second capacitive means, respectively, to said base electrode for providing direct current stabilization of said apparatus.

5. Phase discriminator apparatus comprising: semiconductor amplifying means, said means having a plurality of electrodes including an output electrode, an input electrode, and a common electrode; transformer means including secondary winding means having first and second terminals and an intermediate terminal therebetween, said transformer means being energized by a source of alternating current potential; means connecting said intermediate terminal to said output electrode; first and second asymmetric conducting means, said first and second means being connected, respectively, in circuit with said first and second terminals; first and second capacitive means; first circuit means including said first asymmetric conducting means and said first capacitive means connected intermediate said first terminal and said common electrode; second circuit means including said second asymmetric conducting means and said second capacitive means connected intermediate said second terminal and said common electrode; impedance means connected to said first and second capacitive means; output means connected to said impedance means; and a source of alternating signal potential of the same frequency as said alternating current potential, said signal source being connected intermediate said input and common electrodes.

6. Semiconductor apparatus comprising: semiconductor amplifier means, said means having a plurality of electrodes including a collector electrode, an emitter electrode and a base electrode; a source of alternating voltage having first, second and third terminals and producing two alternating voltages of opposite phase between the first and second terminals and the second and third terminals respectively; means connecting said third terminal to said collector electrode; first and second impedance means; means including first asymmetrical current conducting means connecting said first terminal to said emitter electrode through said first impedance means; means including second asymmetrical current conducting means connecting said second terminal to said emitter electrode through said second impedance means; differential output means connected to said first and second impedance means; a source of signal potential connected intermediate said base and emitter electrodes; and first and second feedback circuits connected from said first and second impedance means, respectively, to said base electrode to provide direct current stabilization of said apparatus without causing any degeneration to the dynamic response of the apparatus.

7. Discriminator apparatus comprising: semiconductor amplifying means, said means having a plurality of electrodes including a collector electrode, an emitter electrode, and a base electrode; transformer means energized from a source of alternating power, said transformer means including secondary winding means having first and second terminals and an intermediate terminal therebetween; means connecting said intermediate terminal to said collector electrode; first and second asymmetric conducting means, said first and second means being connected, respectively, in circuit with said first and second terminals; first and second impedance means; first circuit means including said first asymmetric conducting means and said first impedance means connected intermediate said first terminal and said emitter electrode; second circuit means including said second asymmetric conducting means and said second imepdance means connected intermediate said second terminal and said emitter electrode; output means connected to said impedance means; and a source of alternating signal potential, said signal source being connected intermediate said base and emitter electrodes.

8. Semiconductor phase sensitive discriminator means for providing a polarity reversible direct current output potential comprising: semiconductor amplifier means, said semiconductor amplifier means having a plurality of electrodes including control and output electrodes; transformer means energized from a source of alternating power, said transformer means including a center tapped secondary winding having first and second terminal connections; first and second capacitors; first circuit means including said first capacitor connecting one of said output electrodes to said first terminal connection; second circuit means including said second capacitor connecting said one output electrode to the second terminal connection; means directly connecting the other of said output electrodes to said center tap; asymmetric current conducting means connected in circuit with said first and second terminal connections to rectify said alternating currents whereby the first and second circuits are rendered conductive on alternate and opposite half cycles; means connecting said control electrode to a source of reversible phase alternating signal potential of the same frequency as said alternating current source, said signal potential being effective to control the conductivity of said semiconductor means; first and second impedance means connected across said capacitors, respectively, for providing a differential output potential thereacross having a polarity dependent upon the phase of said signal potential; and first and second degenerative current feedback paths connected from said first and second impedance means, respectively, to the control electrode of said semiconductor means.

9. Transistor phase sensitive discriminator amplifier means for prividing a polarity reversible direct current output potential comprising: transistor means, said transistor means having a plurality of electrodes including a collector, an emitter, and a base electrode; first circuit means including first impedance means connecting said emitter electrode to a source of alternating potential having a first phase relation; second circuit means including second impedance means connecting said emitter to a source of alternating potential of the opposite phase, said first and second circuit means also being connected to said collector electrode; asymmetric current conducting means connected in circuit with said first and second alternating potentials to rectify said potentials whereby the first and second circuits are rendered conductive on alternate and opposite half-cycles; means connecting said emitter and base electrodes to a source of reversible phase alternating signal potential of the same frequency as said first and second source; first and second resistive means connected across said first and second impedance means for providing a differential output potential thereacross having a polarity dependent upon the phase of said signal potential; and first and second degenerative feedback means connected from said first and second resistive means, respectively, to the base electrode of said transistor means.

10. Transistor phase sensitive discriminator amplifier means for providing a polarity reversible direct current output potential comprising: transistor means, said transistor means having a plurality of electrodes including a collector, an emitter, and a base electrode; first circuit means including a first capacitor connecting said emitter electrode to a source of alternating potential having a first phase relation; second circuit means including a second capacitor connecting said emitter to a source of alternating potential of the opposite phase, said first and second circuits also being connected to said collector electrode; asymmetric current conducting means connected in circuit with said first and second alternating potential sources to rectify said potentials whereby the first and second circuits are conductive on alternate and opposite half cycles; means connecting said emitter and base electrodes to a source of reversible phase alternating signal potential of the same frequency as said first and second source; and differential output impedance means connected across said first and second capacitors for providing a direct current differential output potential having a polarity dependent on the phase of said signal potential.

11. Semiconductor control apparatus comprising: phase discriminating means for providing a direct current potential output in response to an alternating signal comprising, semiconductor amplifying means having a plurality of electrodes including a collector electrode, an emitter electrode and a base electrode, the base and emitter being input electrodes, one of the input electrodes and the collector electrode being output electrodes, first and second circuit means each of said circuit means including asymmetric conducting means and capacitive means, means connecting a source of alternating current to said first and second circuit means respectively in opposite phase relation, said first and second circuit means being connected intermediate said current source and one of said semiconductor output electrodes, means connecting a source of phase reversible alternating signal potential to said input electrodes for controlling the conductivity of said semiconductor amplifying means, and differential output means connected to said capacitive means for providing a direct potential output; direct current responsive semiconductor switching means, said semiconductor switching means having a plurality of electrodes including control and output electrodes, said semiconductor switching means having a normal condition of operation whereby said output electrodes present a relatively high impedance to an external circuit and being operable to a switched condition in which condition said output electrodes present a low impedance; and means connecting said discriminator differential output means to said control electrodes of said switching means whereby an alternating signal of the proper phase applied to said discriminator means is effective to operate said switching means from its normal to its switched condition.

12. Transistor control apparatus comprising: phase sensitive discriminator amplifier means for prividing a polarity reversible direct current potential in response to an alternating signal of reversible phase comprising, transistor means, said transistor means having a plurality of electrodes including a collector, an emitter, and a base electrode, first circuit means including a first capacitor connecting said emitter electrode to a first source of alternating potential, second circuit means including a second capacitor connecting said emitter electrode to a second source of alternating potential of the opposite phase, asymmetric current conducting means connected in circuit with said first and second alternating sources to rectify said potentials whereby the first and second circuits are conductive on alternate and opposite half cycles, means connecting said emitter and base electrodes to a source of reversible phase alternating signal potential having the same frequency as said first and second source, means connecting said collector electrode to said first and second source, differential output impedance means connected to said first and second capacitor means providing a differential output potential of reversible polarity dependent upon the phase of said signal potential, and first and second feedback circuits connected to feedback currents from said first and second capacitors to said base electrode; direct current responsive semiconductor switching means, said semiconductor switching means having a plurality of electrodes including control and output electrode, said semiconductor switching means having a normal condition of operation whereby said output electrodes present a relatively high impedance to an external circuit and being operable to a switched condition in which condition said output electrodes present a low impedance; and means connecting said discriminator differential output means to said control electrodes of said switching means whereby an alternating signal of the proper phase applied to said discriminator means is effective to operate said switching means from its normal to switched condition.

References Cited in the file of this patent

UNITED STATES PATENTS

| | | |
|---|---|---|
| 2,689,334 | Coppard | Sept. 14, 1954 |
| 2,780,778 | Root | Feb. 5, 1957 |
| 2,802,067 | Zawels | Aug. 6, 1957 |
| 2,820,143 | D'Nelly | Jan. 14, 1958 |
| 2,828,450 | Pinckaers | Mar. 25, 1958 |
| 2,837,662 | Ehret | June 3, 1958 |